United States Patent [19]
Tobe et al.

[11] Patent Number: 5,721,021
[45] Date of Patent: Feb. 24, 1998

[54] METHOD OF DEPOSITING TITANIUM-CONTAINING CONDUCTIVE THIN FILM

[75] Inventors: Ryoki Tobe; Masao Sasaki; Atsushi Sekiguchi; Ken-ichi Takagi, all of Tokyo, Japan

[73] Assignee: Anelva Corporation, Fuchu, Japan

[21] Appl. No.: 720,867

[22] Filed: Oct. 3, 1996

[30] Foreign Application Priority Data

Oct. 11, 1995 [JP] Japan ................................ 7-288118

[51] Int. Cl.$^6$ .................. H05H 1/73; H05H 1/46; C23C 16/06; C23C 16/50
[52] U.S. Cl. .................. 427/570; 427/571; 427/574; 427/576; 427/255.1; 118/723 E
[58] Field of Search ...................... 427/570, 571, 427/576, 255.1; 118/723 E

[56] References Cited

U.S. PATENT DOCUMENTS

| | | | |
|---|---|---|---|
| 4,557,943 | 12/1985 | Rosler et al. | 427/38 |
| 4,675,206 | 6/1987 | Ikegaya et al. | 427/38 |
| 5,271,963 | 12/1993 | Eichman et al. | 427/248.1 |
| 5,395,642 | 3/1995 | Hamerich et al. | 427/8 |
| 5,462,775 | 10/1995 | Yamada et al. | 427/573 |
| 5,508,066 | 4/1996 | Akahori | 427/571 |
| 5,567,483 | 10/1996 | Foster et al. | 427/535 |

FOREIGN PATENT DOCUMENTS

| | | |
|---|---|---|
| 5-50872 | 8/1993 | Japan. |
| 6-35663 | 5/1994 | Japan. |
| 6-275600 | 9/1994 | Japan. |
| 7-18433 | 1/1995 | Japan. |
| 7-40468 | 6/1995 | Japan. |
| 7-254500 | 10/1995 | Japan. |

OTHER PUBLICATIONS

Jpn. J. Appl. Phys. vol 34 (1995) pp. L516–L519; Part 2, No. 4B, 15 Apr. 1995.
8th Symposium on Plasma Science for Materials; P. 87, Jun. 1995.
Jpn. J. Appl. Phys. vol. 33 (1994) pp. 2189–2193; Part 1, No. 4B, Apr. 1994.
Jpn. J. Appl. Phys. vol 29, No. 6, Jun. 1990; pp. L1015–L018.

*Primary Examiner*—Shrive Beck
*Assistant Examiner*—Bret Chen
*Attorney, Agent, or Firm*—Burns, Doane, Swecker & Mathis, LLP

[57] ABSTRACT

A method of depositing a titanium-containing conductive thin film, which is capable of depositing a high-quality thin film having a low chlorine content by grounding, through a capacitor, a terminal of a plasma generating electrode disposed in a processing chamber. In the method, one of the introduction terminals of the plasma generating electrode is connected to a radio-frequency power source, the other terminal being grounded through the capacitor. Titanium tetrachloride, hydrogen gas, and nitrogen gas are introduced into the processing chamber at flowrates of 20 ml/min, 30 ml/min and 10 ml/min, respectively. The pressure in the processing chamber is set to about 1 Pa, and the temperature of the substrate is set to 450° to 600° C. A low-pressure, high-density plasma is generated with an output of the radio-frequency power source of 2.5 kW to deposit a titanium nitride film at a rate of about 30 nm/min. The resultant titanium nitride film has a chlorine content of 1% or less, metallic lustre and low resistance.

14 Claims, 12 Drawing Sheets

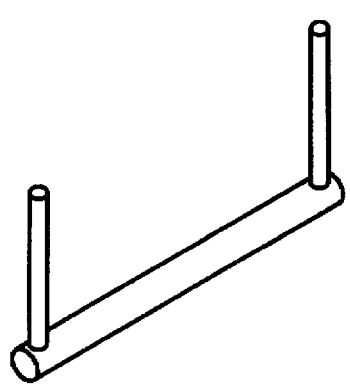 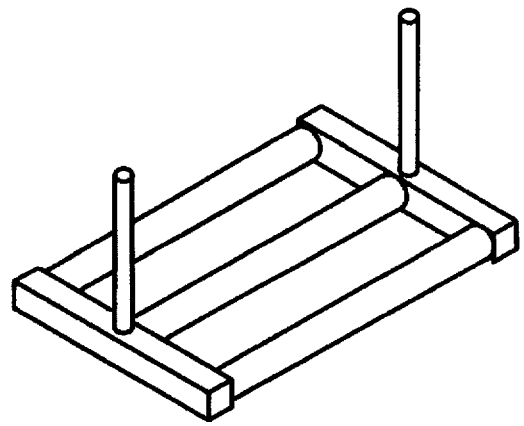
FIG. 12A    FIG. 12B
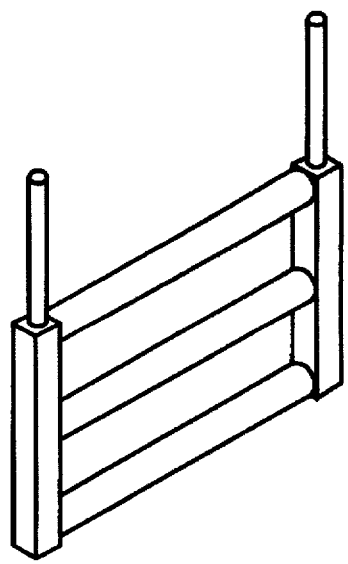
FIG. 12C

METHOD OF DEPOSITING TITANIUM-CONTAINING CONDUCTIVE THIN FILM

BACKGROUND OF THE INVENTION

1. Field of the Invention

The present invention relates to a method of depositing a titanium-containing conductive thin film by using a plasma enhanced Chemical Vapour Deposition (CVD) apparatus comprising a plasma generating electrode provided in a processing chamber.

2. Description of the Related Art

A plasma enhanced CVD method is one method of depositing a thin film on a substrate by chemical reaction of raw material gases using a plasma. This method is widely used for depositing thin films such as metallic films, semiconductor films, insulating films, photoconductor films, barrier films and adhesive layer films, which are used in semiconductor integrated circuit devices, superconductive devices, various electronic devices and various sensors. A plasma generating electrode is generally used for generating a plasma in the processing chamber, and, typically, radio-frequency power is applied to the plasma generating electrode. Systems of plasma generating electrodes can be classified as either a capacitively coupling system or an inductively coupling system. From another viewpoint, systems of plasma generating electrodes can be classified into an external electrode system in which the electrode is provided outside the processing chamber, and an internal electrode system in which the electrode is disposed in the processing chamber. A parallel plate type plasma CVD apparatus which employs the capacitively coupling system and the internal electrode system is widely used.

A parallel plate type plasma CVD apparatus has a structure in which two electrodes are opposed to each other in the processing chamber so that radio-frequency power, low-frequency power, DC power, or time-modulated power can be applied to one of the electrodes, the other electrode being grounded. Alternatively, the other electrode is grounded through a capacitor, a coil (inductor) or combination of a capacitor and a coil. In such a parallel plate type electrode structure, charged particles are accelerated by an electrostatic field between the two electrodes to produce and maintain a plasma by interaction between the respective charged particles or the charged particles and the electrodes at the time of collision therebetween. The parallel plate type plasma CVD apparatus is difficult to generate and maintain a plasma under a pressure of 100 mTorr or less, and cannot produce a low-pressure, high-density plasma.

On the other hand, an inductively coupling system plasma generating method is widely used as an excellent method for generating a low-pressure, high-density plasma.

This is summarized in Hideo Sugai, "New Development of Low-Pressure, High-Density Plasma" Journal of Applied Physics Vol. 63, No. 6, 1994, pp.559–567. In this inductively coupling system, a plasma is generated and maintained by electromagnetic induction due to a change with time of the current which flows through a plasma generating antenna. Namely, a mechanism for generating and maintaining a plasma employs interaction between an electromagnetic wave and charged particles. Therefore, this system can easily generate and maintain a plasma even under a pressure of 100 mTorr or less, and generate a low-pressure, high-density plasma.

The external antenna system is widely used as the inductively coupling system in which a plasma generating antenna is disposed outside a processing chamber. In this system, a coil-shaped or deformed loop-shaped plasma generating antenna is disposed around the outside of a discharge chamber made of a dielectric material, thereby obtaining a low-pressure, high-density plasma. However, this external antenna system has the following drawback. When a film (hereinafter referred to as "a conductive film") having relatively good conductivity, such as a conductor film, a semiconductor film or the like, is formed, a conductive film is deposited on the inner wall of the discharge chamber made of a dielectric material, and thus the electromagnetic wave radiated from the plasma generating antenna disposed around the discharge chamber is cut off by the conductive film formed on the inner wall. The plasma generated in the discharge chamber is thus made unstable, and, in an extreme case, no plasma can be generated. When a plasma is generated by the external antenna system, and when a conductive film is deposited on a substrate, it is necessary to frequently clean the inner surface of the discharge chamber.

A system (hereinafter referred to as an "inner antenna system") for compensating for the drawback of the external antenna system is known in which the inductively coupling antenna is disposed in the processing chamber. Although this inner antenna system plasma generating device is also described in the above paper by Hideo Sugai, a typical apparatus structure is disclosed in Hideo Sugai, Kenji Nakamura, Keiji Suzuki, Japanese Journal of Applied Physics Vol. 33 (1994) pp.2189–2193. Japanese Patent Laid-Open No. 7-18433 discloses a sputtering apparatus which employs the inner antenna system.

In the plasma generating apparatus in the inner antenna system disclosed in the paper by Hideo Sugai et al., an antenna comprising a loop coil of substantially one turn is disposed in the processing chamber, one terminal of the antenna is connected to a radio-frequency power source, and the other terminal is grounded. The surface of the antenna is coated with a dielectric material in order to stabilize a plasma. Deposition of a film on a substrate using this plasma generating apparatus causes the problems below. In deposition of a conductive film on the substrate by the plasma enhanced CVD method, a conductive film is also deposited on the surface of the antenna. The deposition of such a conductive film causes changes in the state of the plasma generated as deposition of a thin film on the substrate proceeds. Therefore, in batch processing for depositing thin films over a long time, the reproduceability of thin film deposition deteriorates, and the effect of the dielectric coating for stabilizing the plasma is eliminated, thereby making the plasma unstable. It is thus necessary to frequently clean the surface of the antenna.

Further, in the plasma generating apparatus disclosed in the paper by Hideo Sugai et al., a DC negative bias voltage is induced in the dielectric coating on the surface of the antenna by the radio-frequency power applied to the antenna. As a result, positive ions are accelerated by a potential difference between the DC bias voltage and the plasma potential, and applied to the dielectric coating on the surface of the antenna to sputter the dielectric coating. Therefore, when such a plasma generating apparatus is used for depositing a film, a material which constitutes the dielectric coating might be mixed in the film to be deposited, thereby easily causing difficulties in forming a high-purity film.

Although, if no dielectric coating is provided on the surface of the antenna in the plasma generating apparatus disclosed in the paper by Hideo Sugai et al., the above drawback is removed, but the following problems may occur. Since an end of the antenna is grounded in a DC manner, no DC bias potential is produced in the antenna, and the potential of the antenna thus changes symmetrically to positive and negative values with time on the basis of the ground potential. Electrons or positive ions as the charged particles flow into the antenna with this change in the antenna potential with time. Since electrons have a much smaller mass than positive ions, electrons have high mobility due to an electric field, and the number of electrons which flow as the charged particles in the antenna is larger than that of positive ions. On the other hand, since no DC bias potential occurs in the antenna, the plasma potential is inevitably shifted to positive potential so as to balance the total charge amount of the charged particles which flow into the antenna. As a result, the electric field between the inner wall of the processing chamber and the plasma is increased, thereby increasing energy for accelerating the positive ions toward the inner wall of the processing chamber. This consequently increases the amount of the secondary electrons generated by collision of the positive ions with the inner wall of the processing chamber, and locally generates self-maintaining discharge somewhere on the inner wall of the processing chamber. This self-maintaining discharge heats the inner wall of the processing chamber to generate hot-cathode arc discharge. In this arc discharge mode, a large current flows between the plasma and the inner wall of the processing chamber. Although this decreases the space potential of the plasma to temporarily stop the self-maintaining discharge, the space potential of the plasma is increased again to produce self-maintaining discharge between the plasma and the inner wall of the processing chamber. In this way, since the space potential of the plasma periodically significantly changes, a stable plasma cannot be obtained. Further, since the inner wall of the processing chamber is locally excessively heated by the hot-cathode arc discharge, the metallic material which constitutes the processing chamber evaporates and causes heavy metal contamination of a substrate to be processed. When no dielectric coating is provided, even if the making power is increased, the electron density of the plasma is very low, as compared with a case where the dielectric coating is provided, and thus a low-pressure, high-density plasma cannot be obtained.

In the sputtering apparatus disclosed in Japanese Patent Laid-Open No. 7-18433, a loop antenna of one turn is disposed in a processing chamber, and one terminal of the antenna is connected to a radio-frequency power source and a bias DC power source, the other terminal being grounded through a DC blocking capacitor. The antenna is used as a target material of the sputtering apparatus. The sputtering apparatus uses the bias power source for applying a DC bias to the antenna serving as a target, and also uses the DC blocking capacitor. When the plasma generating means used in the sputtering apparatus is applied to a plasma CVD apparatus, the antenna must not be used as a sputtering target, and thus the bias electric power and the DC blocking capacitor must be removed in principle. This case creates the same state as the plasma generating apparatus disclosed in the paper by Hideo Sugai et al. in which the surface of the antenna is coated with a metal, thereby causing the same problems as described hereinabove.

SUMMARY OF THE INVENTION

The present invention has been achieved for solving the above problems. An object of the present invention is to stably deposit a titanium-containing conductive thin film by the plasma enhanced CVD process using a low-pressure, high-density plasma over a long period of time.

In one embodiment of the present invention, there is provided a method of depositing a titanium-containing conductive thin film by the plasma enhanced CVD process, comprising providing a plasma generating electrode having two terminals in a processing chamber, connecting one of the two terminals of the plasma generating electrode to a radio-frequency power supply source, and grounding the other terminal through a capacitor to generate a plasma in the processing chamber. This method significantly improves the quality of the titanium-containing conductive thin film, as compared with a conventional method.

In the method of the present invention, the plasma generating electrode is grounded through the capacitor so that the plasma generating electrode is floated on the ground potential in a DC manner, thereby generating a DC bias component in the plasma generating electrode. As a result, the plasma can stably be generated and maintained without significant increase in the space potential of the plasma. Further, the DC bias component induced in the plasma generating electrode can be controlled by changing the capacity of the capacitor, and the sputtering phenomenon of the plasma generating electrode can be optimized so as to stably maintain plasma processing while cleaning the plasma generating electrode over a long period of time.

Examples of materials for the titanium type conductive thin film include metallic titanium, titanium nitride, titanium silicide, tungsten nitride and the like. All materials have a resistivity of 100 $\mu\Omega$cm or less, and can be used as, for example, conductive thin films of semiconductor devices.

It is suitable that the capacitor has a capacity of 100 pF to 10 $\mu$F. With a capacity excessively lower than this range, discharge is easily made unstable, and a capacity excessively higher than this range is unpractical because when a ceramic capacitor having good radio-frequency characteristics and high voltage resistance is used, the size of the capacitor is excessively increased.

Although the processing chamber is generally grounded, the processing chamber may be floated on the ground in a DC manner. Namely, a capacitor may be inserted between the processing chamber and ground. In this case, the potential of the processing chamber may be adjusted by controlling the capacity of the capacitor.

BRIEF DESCRIPTION OF THE DRAWINGS

FIG. 12a–C is a perspective view showing other modified embodiments of the plasma generating electrode.

DESCRIPTION OF THE PREFERRED EMBODIMENTS

Figure 1:
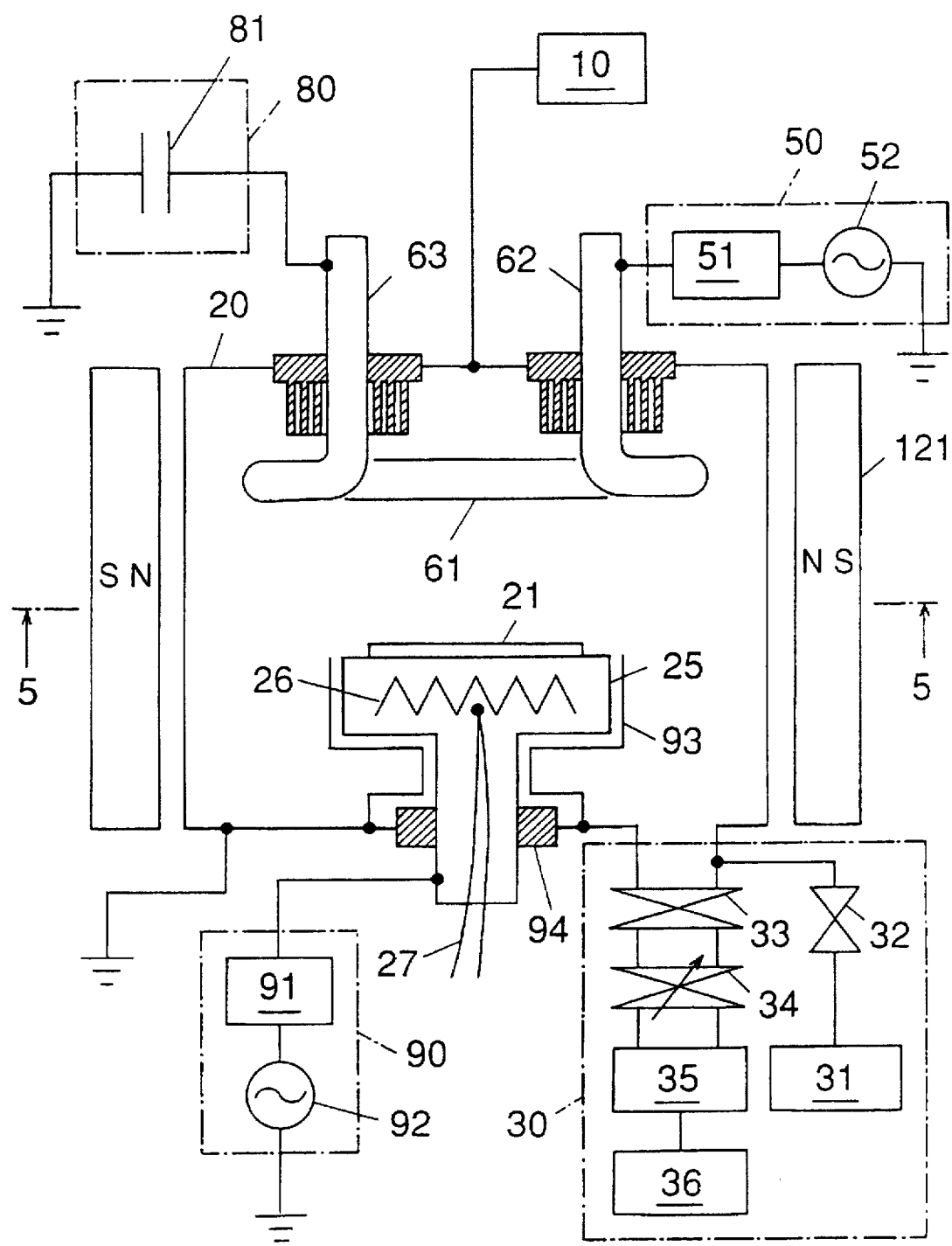
FIG. 1 is a block diagram of a plasma enhanced CVD apparatus according to one embodiment for carrying out a method of the present invention.

FIG. 1 is a block diagram of a plasma enhanced CVD apparatus in an embodiment of the present invention, with a sectional front view of a processing chamber 20. In the processing chamber 20 in which a vacuum can be maintained, are disposed a substrate holder 25 and a plasma generating electrode 61. A power supply source 50 and a ground coupling mechanism 80 are connected to the plasma generating electrode 61. A bias power supply source 90 is connected to the substrate holder 25. A gas introduction mechanism 10 and an exhaust mechanism 30 are connected to the processing chamber 20.

Figure 2:
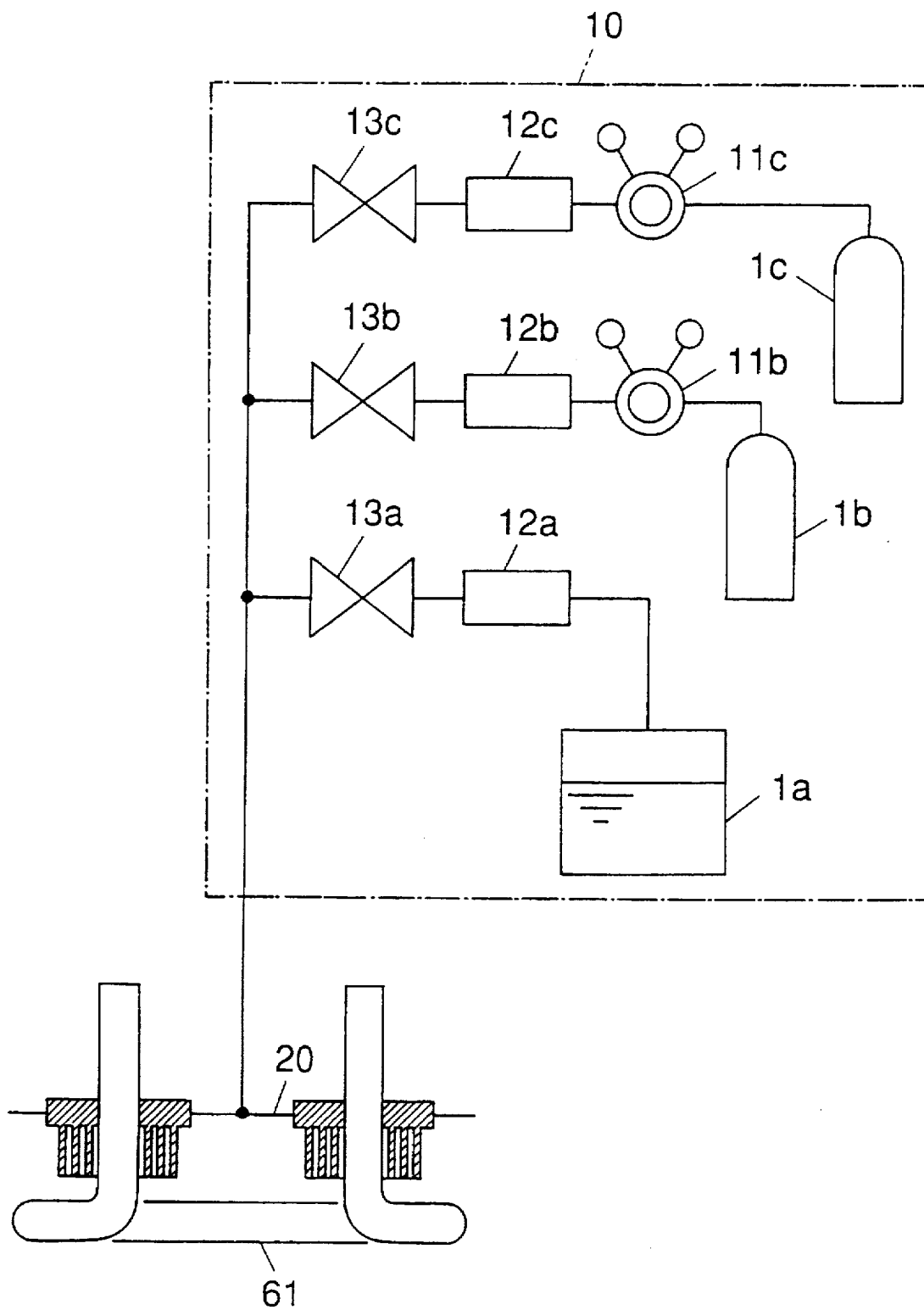
FIG. 2 is a block diagram of a gas introduction mechanism.

The gas introduction mechanism 10 is first described with reference to FIG. 2 which is a block diagram of the gas introduction mechanism 10. The introduction mechanism 10 is capable of using three types of raw material gases. A raw material container 1a is a constant temperature bath for heating a raw material which is liquid at room temperature and pressure, to a predetermined temperature so that the raw material is evaporated by the constant temperature bath and introduced into the processing chamber 20 through a mass flow controller 12a and a valve 13a. Raw material containers 1b and 1c are high pressure gas cylinders for containing raw material gases which are respectively passed through reducing valves 11b and 11c for reducing the pressure of the raw material gases and mass flow controllers 12b and 12c for controlling the flowrates of the raw material gases, and introduced into the processing chamber 20 by opening valves 13b and 13c. The outlet of the gas introduction mechanism 10 is open near the center of the plasma generating electrode 61. Although the valves 13a, 13b and 13c are open when the raw material gases are introduced, the valves 13a, 13b and 13c are closed for preventing air contamination of the raw material gases when air is introduced into the processing chamber 20.

Turning to FIG. 1, the structure of the substrate holder 25 is described. A substrate 21 is placed on the substrate holder 25 in which a heater 26 and a thermocouple 27 are provided. The temperature of the substrate holder 25 is measured by the thermocouple 27 so that the temperature of the substrate 21 is controlled by supplying electric power to the heater 26 from a substrate temperature controller not shown in the drawing. Although the substrate temperature controller employs a Proportional, Integral and Derivative (PID) control method, a fuzzy circuit may be used in combination with the PID control method, or PI control or simple ON-OFF control may be used according to demand.

The exhaust mechanism 30 will be described. A roughing vacuum pump 31 comprises an oil-sealed mechanical pump (pumping speed: 650 l/min), and is connected to the processing chamber 20 through a roughing vacuum pump valve 32. When the cleanliness of the processing chamber 20 is very important, an oil-free pump can be used as the roughing pump 31. A dry pump may be used for improving maintenance. A main pump 35 is connected to the processing chamber 20 through a variable orifice 34 and a main valve 33, an auxiliary pump 36 being connected to the rear stage of the main pump 35. The main pump 35 comprises a composite turbo-molecular pump (pumping speed: 1300 l/min), and an oil diffusion pump may be used if the cleanliness of the processing chamber 20 is not so important. Like the roughing vacuum pump 31, the auxiliary pump 36 comprises an oil-sealed mechanical pump (pumping speed: 1180 l/min), and a dry pump may be used as the auxiliary pump 36.

When the processing chamber 20 under atmospheric pressure is vacuumized, the roughing vacuum pump valve 32 is opened, and the processing chamber 20 is vacuumized by using the roughing vacuum pump 31. After the pressure in the processing chamber 20 is reduced to a predetermined pressure which depends upon the exhaust system, but is about 100 Pa in this embodiment, the roughing vacuum pump valve 32 is closed, the main valve 33 is opened, and the processing chamber 20 is further vacuumized to a low pressure by using the main pump 35. The pressure in the processing chamber 20 can be controlled to a predetermined value by opening and closing the variable orifice 34 on the basis of the pressure of the processing chamber 20 which is measured by a vacuum gauge. The variable orifice 34 is effective for obtaining a stable plasma with high reproduceability.

The mechanism for applying bias power to the substrate will now be described. The substrate holder 25 is connected to a bias radio-frequency power source 92 through an impedance matching circuit 91. A bias power supply source 90 comprises the impedance matching circuit 91 and the bias radio-frequency power source 92. After the impedance of alternating power induced by the bias radio-frequency power source 92 is adjusted by the impedance matching circuit 91, the alternating power is supplied to the substrate holder 25 to control the bias voltage of the substrate 21. A shield plate 93 connected to the processing chamber 20 is provided around the substrate holder 25. The substrate holder 25 is electrically insulated from the processing chamber 20 by an insulator 94. The frequency of the bias radio-frequency power source 92 must be different by 500 Hz or more from the frequency of the radio-frequency power source 52 for generating a plasma, otherwise a stable plasma cannot be obtained due to interference between the two radio frequencies. In this embodiment, the frequencies of the radio-frequency power source 51 for generating a plasma and the bias radio-frequency power source 92 are 13.560 MHz and 13.562 MHz, respectively.

Figure 5:
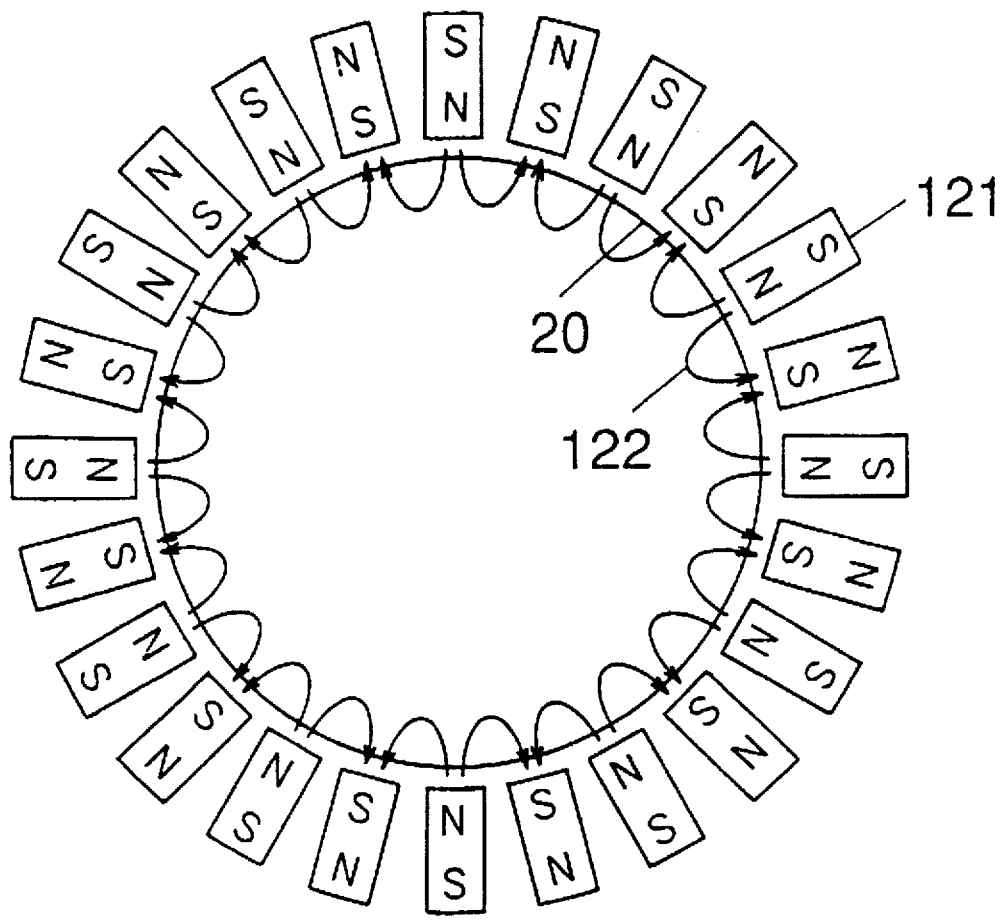
FIG. 5 is a sectional view taken along line 5—5 of FIG. 1.

The magnetic field generating mechanism will now be described. Many long thin permanent magnets 121 are vertically disposed around the processing chamber 20. FIG. 5 is a sectional view taken along line 5—5 in FIG. 1, showing a horizontal section of the processing chamber 20. The 24 permanent magnets 121 are disposed at equal intervals around the processing chamber 20 so that the adjacent permanent magnets 121 have opposite polarities. Namely, the N and S poles of the respective permanent magnets are radially arranged so as to be alternately arranged along the periphery of the processing chamber 20. A multi-cusp magnetic field 122 is formed near the inner wall of the processing chamber 20 by the action of these permanent magnets 121. The shape and the number of the permanent magnets are not limited to those described above, and other shape and number of permanent magnets can be employed as long as N and S poles of the permanent magnets are radially arranged so as to be alternately arranged along the periphery of the processing chamber 20.

Each of the permanent magnets 121 comprises a lanthanide rare earth magnet (dimensions 25.4 mm ×6.3 mm ×12.8 mm). Although the magnet has surface magnetic flux density of 1600 gauss, a magnet having surface magnetic flux density within the range of about 400 to 2200 gauss is effective. If the magnetic flux density is excessively low, the effect of confining the plasma generated is decreased, thereby deteriorating uniformity in surface processing of the periphery of the substrate. If the magnetic flux density is excessively high, the plasma is separated too much from the inner wall of the processing chamber, thereby decreasing the region where plasma uniformity is maintained, as compared with the internal diameter of the processing chamber 20. The interval of magnetic poles is preferably 150 mm or less. If the interval of magnetic poles is excessively large, the magnetic flux density at the centers between the respective magnetic poles is decreased, thereby decreasing the plasma confining effect. In this embodiment, the interval of magnetic poles is 24 mm.

The use of such a multi-cusp magnetic field 122 prevents diffusion of the plasma to the vicinity of the inner wall of the processing chamber 20 by the magnetic field effect of confining the plasma, and thus maintains a uniform high-density plasma. The combination of the multi-cusp magnetic field 122 and the bias power supply source enables a large current to uniformly flow into the surface of a large substrate.

Figure 3:
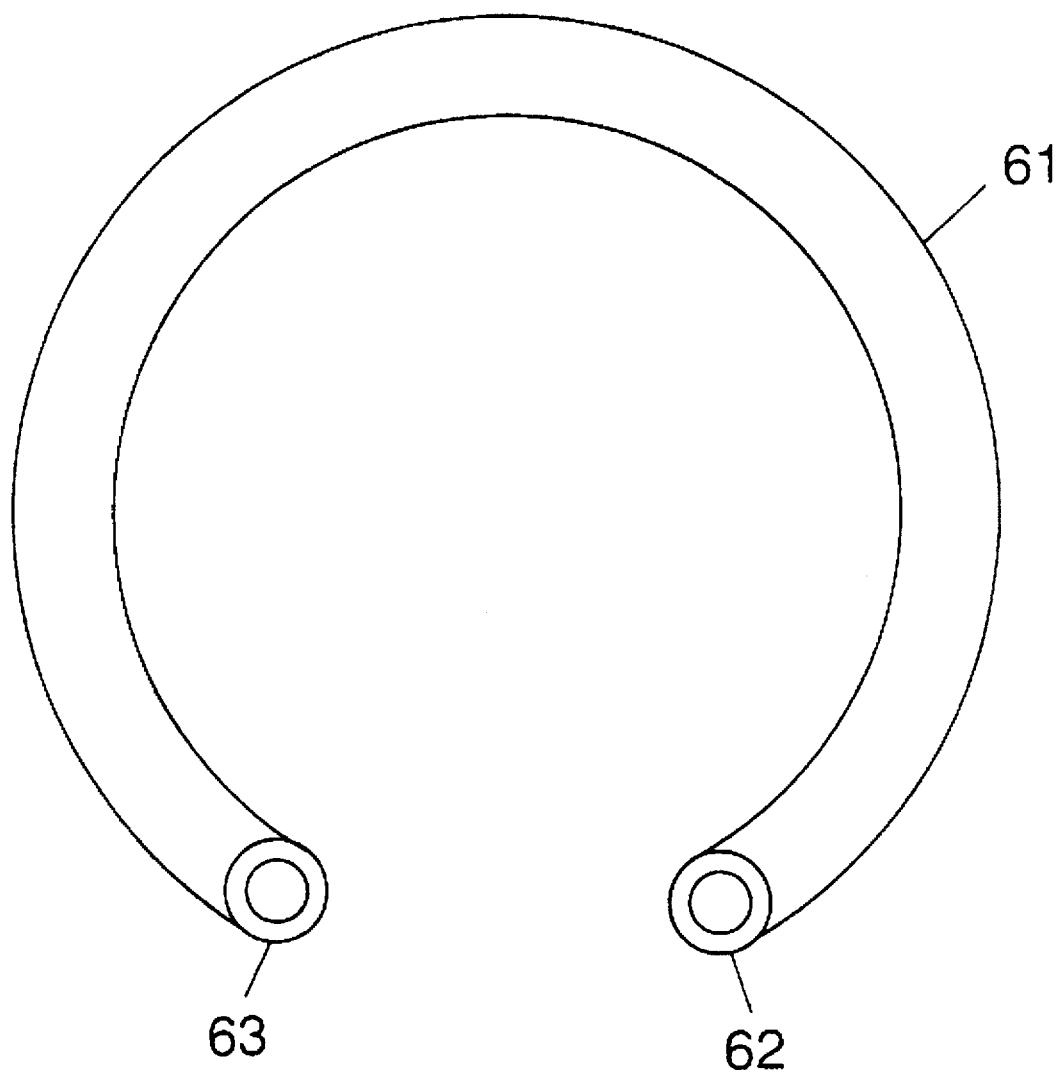
FIG. 3 is a plan view of a plasma generating electrode.

The plasma generating apparatus will be described below. The plasma generating apparatus is adapted for generating a plasma in the processing chamber 20, and comprises the power supply source 50, the plasma generating electrode 61 and the ground coupling mechanism 80, as shown in FIG. 1. The plasma generating electrode 61 comprises a coil of substantially one turn, is provided with a pair of introduction terminals 62 and 63 passed through the wall of the processing chamber 20, and is arranged opposite the substrate 21. FIG. 3 is a plan view of the plasma generating electrode 61. The plasma generating electrode 61 comprises a metallic pipe which is bent in a substantially ring form having a diameter of about 140 mm. The introduction terminals 62 and 63 are formed perpendicularly to the ring portion. Since the metallic pipe is exposed in the processing chamber 20, the plasma generating electrode 61 has a conductive surface. The electrode 61 can be water-cooled by flowing cooling water through the metallic pipe. However, if required, air cooling can be made, and the use of low power has no need for cooling.

The mechanism for cooling the plasma generating electrode 61 will be described. In this embodiment, the introduction terminals 62 and 63, and the plasma generating electrode 61 are hollow so that cooling water can be passed therethrough. To the introduction terminals 62 and 63 are respectively connected water passing tubes made of a fluororesin. Water under a pressure of about 5 kg/cm$^2$ is supplied to the supply-side tube, and the exhaust-side tube is close to atmospheric pressure. The cooling water temperature at the supply port is about 15° C. and the flowrate of water passing through the plasma generating electrode 61 is about 3 1/min. Although water is most suitable as a cooling medium from the viewpoints of high specific heat, high availability, and low viscosity, other media may be used. When air cooling or nitrogen gas cooling is performed, the flowrate may be increased. Nitrogen gas cooling can prevent moisture corrosion of the electrode because no water is contained in the gas.

Since the plasma generating electrode 61 directly contacts the plasma, the surface of the plasma generating electrode 61 is possibly etched by the plasma. In an experiment, etching could be prevented by water-cooling the plasma generating electrode, thereby extending the life of the plasma generating electrode 61. Without water cooling, the rate of erosion of the plasma generating electrode 61 was 0.1 mm/hr.

However, with water cooling, the rate of erosion was 0.01 mm/hr. Although etching of the plasma generating electrode 61 possibly causes contamination of a film on the substrate with impurities, the etching amount can be decreased by water cooling.

Figure 4:
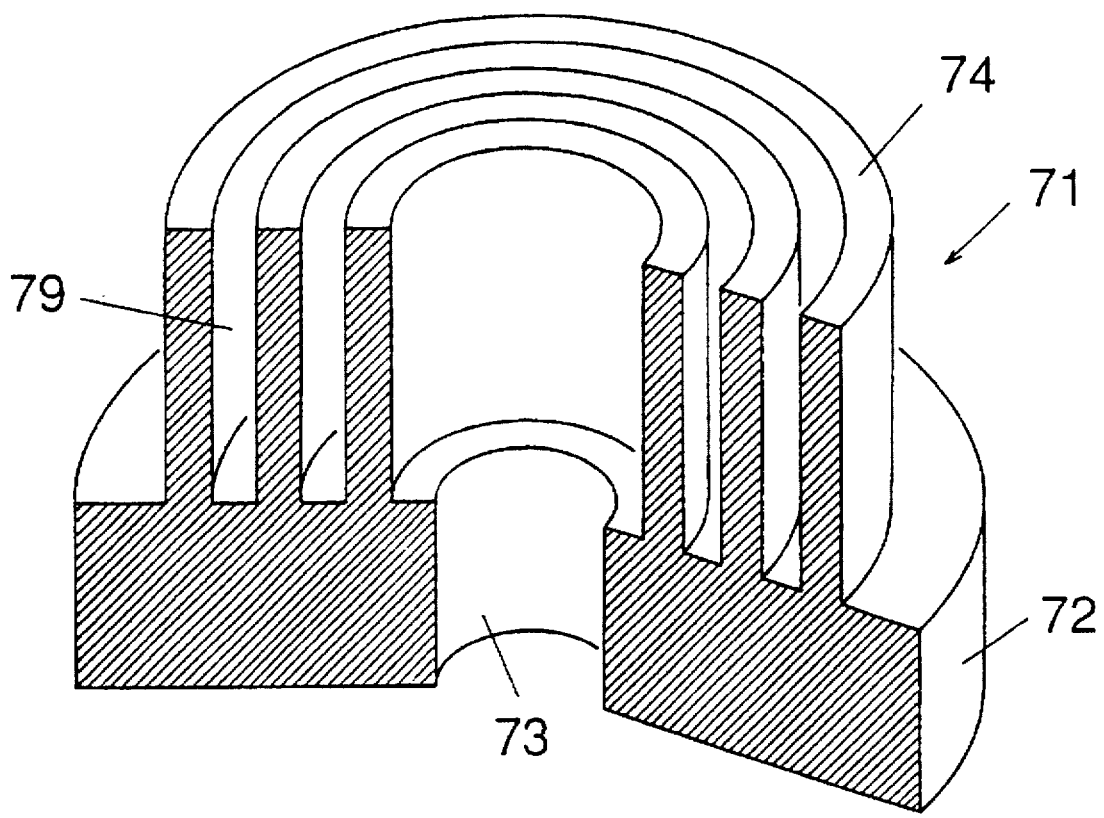
FIG. 4 is a partially cut-away perspective view of an insulating ring.

FIG. 4 is a partially cutaway perspective view of an insulating ring 71 provided between each of the introduction terminals 62, 63 of the plasma generating electrode 61 and the processing chamber 20. The insulating ring 71 comprises an electrically insulating material such as quartz glass. The insulating ring 71 and each of the introduction terminals 62 and 63 of the plasma generating electrode 61, and the insulating ring 71 and the processing chamber 20 are vacuum-sealed. The insulating ring 71 comprises a disk 72 having a circular through hole 73 formed at the center thereof, and three ring-shaped projections 74 which are concentrically formed on one side (the side exposed to the space of the processing chamber) of the insulating ring 71. Two ring-shaped grooves 79 are formed between the respective ring-shaped projections 74. The grooves 79 are open in a plane perpendicular to the axis of the through hole 73, and the depthwise direction of the grooves 79 is parallel with the axis of the through hole 73. All of the projections 74 and grooves 79 are concentric with the through hole Into the through hole 73 is inserted the cylindrical introduction terminal 62 (refer to FIG. 1) of the plasma generating electrode 61. Since all of the ring-shaped projections 74 are 50 mm high and 1 mm thick, the grooves 79 are 50 mm deep. The grooves 79 have a width (distance between the adjacent projections 74) of 1 mm. All surfaces of the ring-formed projections 74 and the surface (the upper side in FIG. 4) of the disk 72 which is exposed in the processing chamber 20, are roughened by blasting. This roughening prevents peeling-off of a film which adheres to the insulating ring 71, and thus prevents dust contamination of the interior of the processing chamber 20 due to peeling-off of the film. In detail, a film possibly adheres to portions other than the insides of the grooves 79 of the insulating ring 71, for example, the top surfaces of the projections 74, the outer periphery of the outermost projection 74 and the surface of the disk 72 outside the outermost projection 74. If these portions are roughened, the films which adhere to the portions hardly peel off.

Turning to FIG. 1, the introduction terminal 62 of the plasma generating electrode 61 is connected to the radio-frequency power source 52 through the impedance matching circuit 51. The power supply source 50 comprises the impedance matching circuit 51 and the radio-frequency power source 52. The radio-frequency power source 52 has a frequency of 13.56 MHz and a rated output of 3 kW. However, the frequency is not limited to this, a frequency in the kHz order, 60 MHz and 100 MHz may be used, and the usable range is about 10 kHz to 1000 MHz. If the frequency exceeds the upper limit of this range, a conductor may not be used as a wiring material, and, if the frequency is below the lower limit, no electric wave is transmitted. The output waveform may be a sine wave or a waveform obtained by predetermined deformation of the sine wave. Although the impedance matching circuit 51 comprises a II type circuit, other circuits, e.g., a T circuit, may be used. After the impedance of the alternating power induced by the radio-frequency power source 52 is modulated by the impedance matching circuit 51, the alternating power is supplied to the plasma generating electrode 61.

Figure 11A:
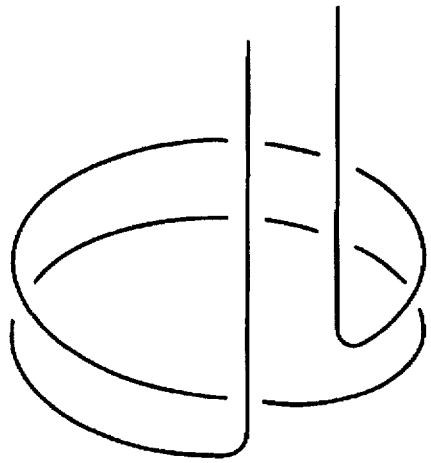
FIG. 11a–D is a perspective view showing modified embodiments of the plasma generating electrode.
Figure 11B:
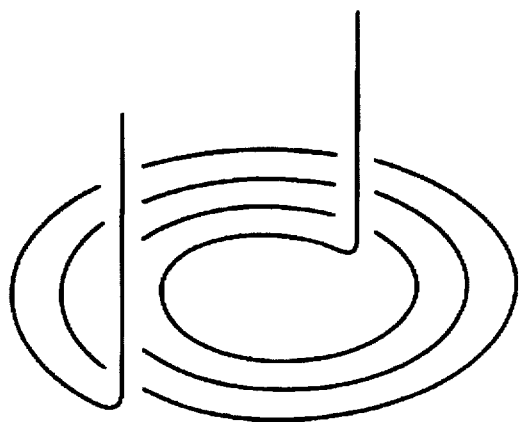
Figure 11C:
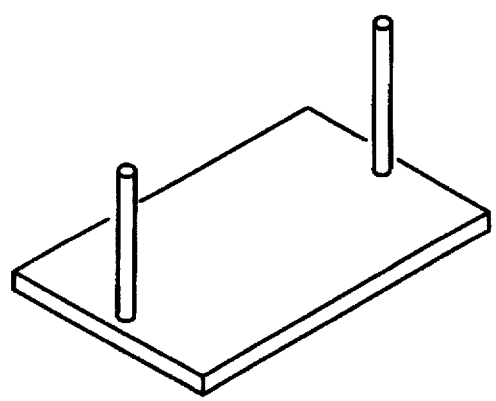
Figure 11D:
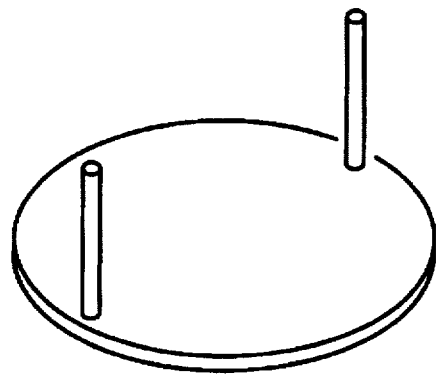

Although, in the foregoing embodiment, the plasma generating electrode 61 comprises a coil of one turn, other forms may be used. FIG. 11(A) shows an embodiment in which the plasma generating electrode 61 comprises a coil of two turns, and a coil may have three turns or more. FIG. 11(B) shows an embodiment in which the plasma generating electrode 61 comprises a spiral coil in a horizontal plane, FIG. 11(C) shows an embodiment in which the plasma generating electrode 61 comprises a rectangular plate, and FIG. 11(D) shows an embodiment in which the plasma generating electrode 61 comprises a disk-like plate. FIG. 12(A) shows an embodiment in which the plasma generating electrode 61 comprises a linear rod, FIG. 12(B) shows an embodiment in which the plasma generating electrode 61 comprises three rod electrodes which are horizontally arranged in parallel, and FIG. 12(C) shows an embodiment in which the plasma generating electrode 61 comprises three rod electrodes which are vertically arranged in parallel. The electrodes of all embodiments shown in FIGS. 11 and 12 are provided with two terminals one of which is connected to the radio-frequency power source, the other being grounded through the capacitor. In any one of the embodiments, the two terminals are disposed near the both ends of the plasma generating electrode, and the plasma generating electrode and the two terminals can be cooled by passing cooling water through the insides thereof.

Turning to FIG. 1, the ground coupling mechanism 80 will be described below. The ground coupling mechanism 80 is provided between the introduction terminal 63 of the plasma generating electrode 61 and the processing chamber 20, and includes a capacitor 81 for cutting off an end of the plasma generating electrode 61 from the ground in a DC manner. In this embodiment, the capacitor 81 has an electrostatic capacity of about 500 pF. However, the capacity is not limited to this, and a capacity of about 100 pF to 10 μF may be employed according to processing conditions. On the other hand, the floating capacity between the plasma generating electrode 61 and the processing chamber 20 is several pF. The capacitor 81 suitably comprises a ceramic capacitor having excellent radio-frequency characteristics and voltage resistance.

Figure 8:
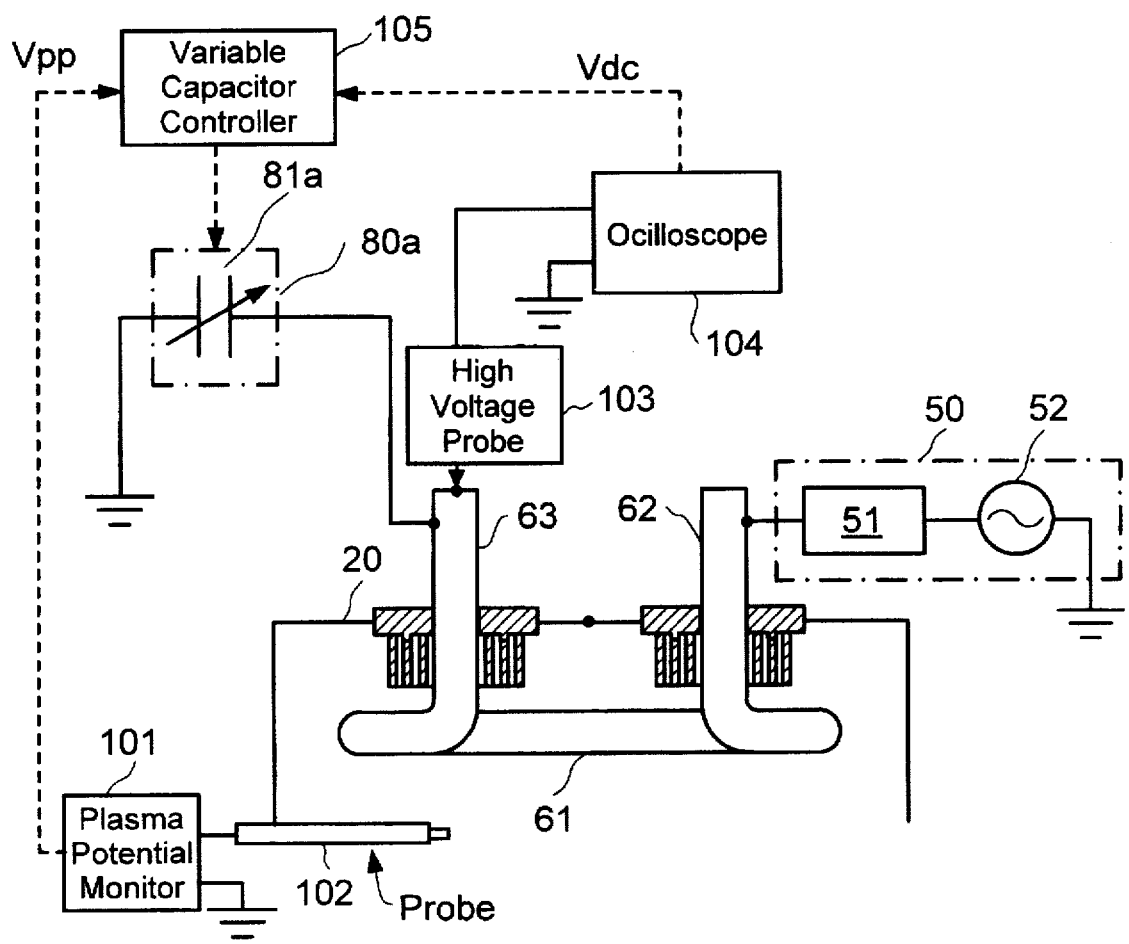
FIG. 8 is a block diagram showing a modified embodiment of a ground coupling mechanism.
Figure 9:
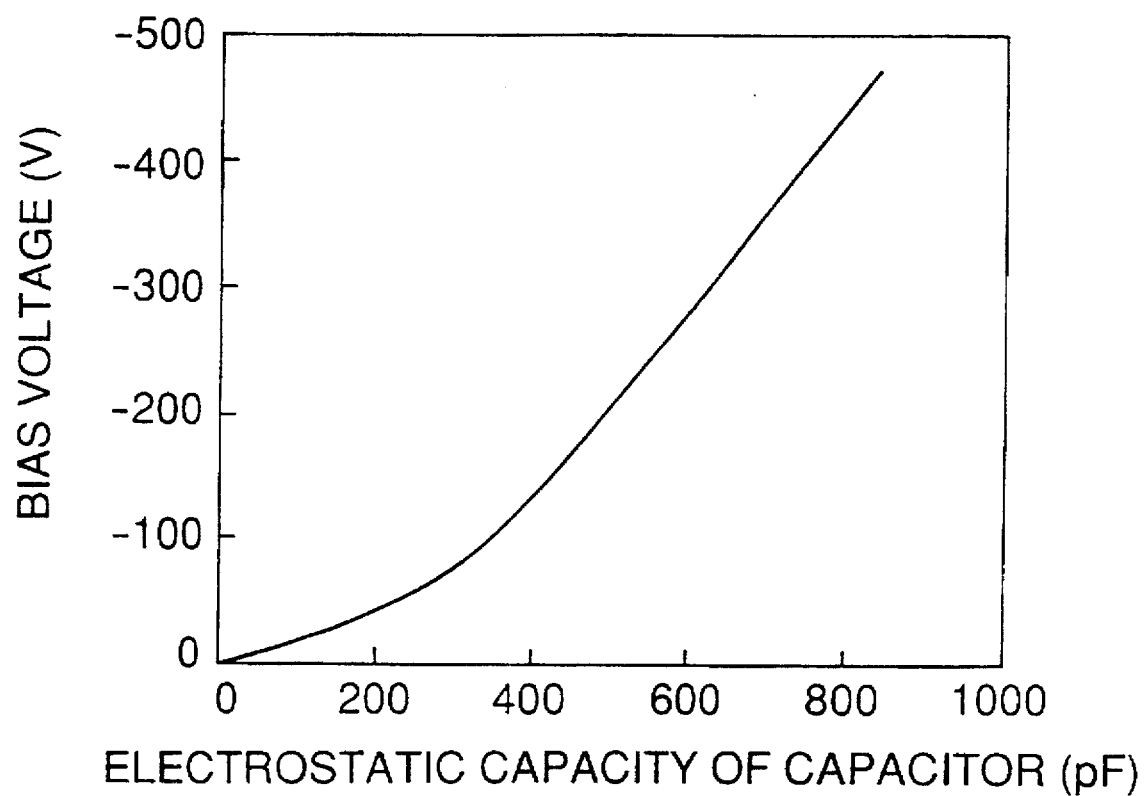
FIG. 9 is a graph showing the relation between the capacitor capacity and the DC bias voltage of a plasma generating electrode.

When a plasma is generated in the processing chamber 20, a DC bias voltage is induced in the plasma generating electrode 61 due to the presence of the capacitor 81 of the ground coupling mechanism 80. FIG. 9 is a graph showing the relation between the electrostatic capacity of the capacitor 81 and the bias voltage induced in the plasma generating electrode 61. The graph indicates that the absolute value of the DC bias voltage changes according to the capacity of the capacitor. Therefore, the DC bias voltage of the plasma generating electrode 61 can be set to any desired value by changing the capacity of the capacitor. When the plasma generating electrode 61 is sputtered, the absolute value of the DC bias voltage is decreased by decreasing the capacity of the capacitor 81, thereby preventing sputtering of the plasma generating electrode 61. When a variable capacitor 81a is used as a ground coupling mechanism 80a, as shown in FIG. 8, the capacity of the capacitor 81a can simply be changed, and thus the DC bias voltage of the plasma generating electrode 61 can easily be controlled. When the DC bias component of the plasma generating electrode 61 is monitored, in batch plasma processing, the capacity of the capacitor can be controlled so that the DC bias component is kept constant even if plasma processing conditions slightly vary with an increase in the number of times of batch processing.

As illustrated in FIG. 8, a high voltage probe 103 that is monitored by an oscilloscope 104 or a digital multimeter can be used to monitor the direct current bias component $V_{dc}$ of the plasma generating electrode 61. In addition, a plasma potential $V_{pp}$ is monitored by a plasma potential monitor 101 and connected probe 102. Signals representative of the plasma potential $V_{pp}$ and the DC bias voltage $V_{dc}$ are input into a variable capacitor controller 105, which includes a CPU for controlling the variable capacitor 81a. In order to suppress sputtering of the electrode 61, the plasma potential $V_{pp}$ is preferably kept below 50 volts and the DC bias voltage $V_{dc}$ is kept to a minimum using the variable capacitor controller 105.

The above-mentioned sputtering effect can be reversely employed. For example, when a film is deposited on the substrate, a film might be also deposited on the plasma generating electrode. In this case, the capacity of the capacitor can be controlled by appropriately increasing the capacity so that only the film deposited on the plasma generating electrode 61 is sputtered, and the plasma generating electrode itself is not sputtered.

Figure 10:
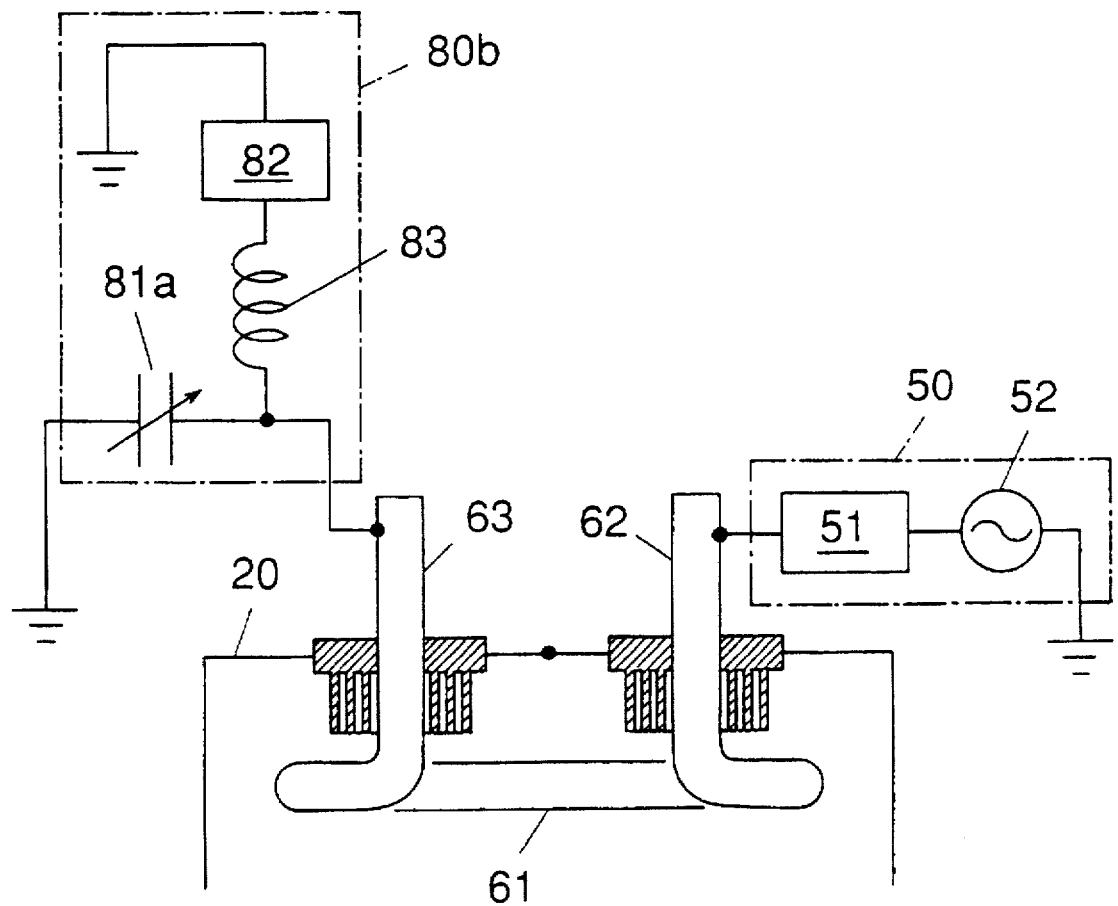
FIG. 10 is a block diagram showing a modified embodiment of the ground coupling mechanism.

FIG. 10 shows a ground coupling mechanism in accordance with another embodiment. The ground coupling mechanism 80b comprises a DC power source 82 which is connected between the introduction terminal 63 of the plasma generating electrode 61 and the variable capacitor 81a through an inductor 83. This is capable of more positively controlling the potential of the plasma generating electrode 61.

In FIG. 1, if the introduction terminal 63 of the plasma generating electrode 61 is grounded directly without the capacitor 81, the plasma in the processing chamber 20 causes discharge with a high degree of capacitively coupling, and thus spreads over the whole space of the processing chamber 20 and further to the space in the exhaust mechanism 30, thereby decreasing the electron density of the plasma. On the other hand, when the introduction terminal 63 is grounded through the capacitor 81, a plasma is locally generated in the central portion in the processing chamber 20, thereby increasing the electron density of the plasma. Specifically, when a plasma is generated by introducing argon gas into the processing chamber 20 under pressure of 6 mtorr with a making power of 2 kW for the plasma generating electrode, the electron density of the plasma reaches $10^{11}/cm^3$.

Description will now be made of an embodiment in which a thin film is deposited by using the plasma enhanced CVD apparatus shown in FIG. 1. A first example in which a titanium nitride film is deposited is described. In FIGS. 1 and 2, titanium tetrachloride, hydrogen gas, and nitrogen gas were used as first, second, and third raw materials which were contained in the raw material containers 1a, 1b and 1c, respectively. The flowrates of titanium tetrachloride, hydrogen gas, and nitrogen gas were 20 ml/min, 30 ml/min, and 10 ml/min, respectively. The pressure in the processing chamber 20 was set to about 1 Pa, and the temperature of the substrate 21 was set to 450 to 600° C. The output of the radio-frequency power source was 2.5 kW, and the capacity of the capacitor 81 was 500 pF. When a thin film was deposited under these conditions, a film mainly consisting of titanium nitride was deposited at a rate of about 30 nm/min. This deposition produced no change of the plasma with time, and no phenomenon that the plasma is not generated, which are observed in a conventional apparatus. The apparatus of the present invention was effective to deposit a conductor thin film such as a titanium nitride thin film. Further, no metallic thin film was observed on the surface of the plasma generating electrode.

When a titanium nitride film was deposited by using the plasma generating electrode grounded directly, at least 1% of chlorine (contained in titanium tetrachloride used as the raw material gas) was mixed in the titanium nitride film, thereby causing the phenomenon that the titanium nitride film was changed to black. On the other hand, in the present invention, the amount of chlorine mixed in the titanium nitride film was decreased to not more than 1% by employing the capacitor 81, as shown in FIG. 1, and thus the titanium nitride film was not discolored.

Figure 6:
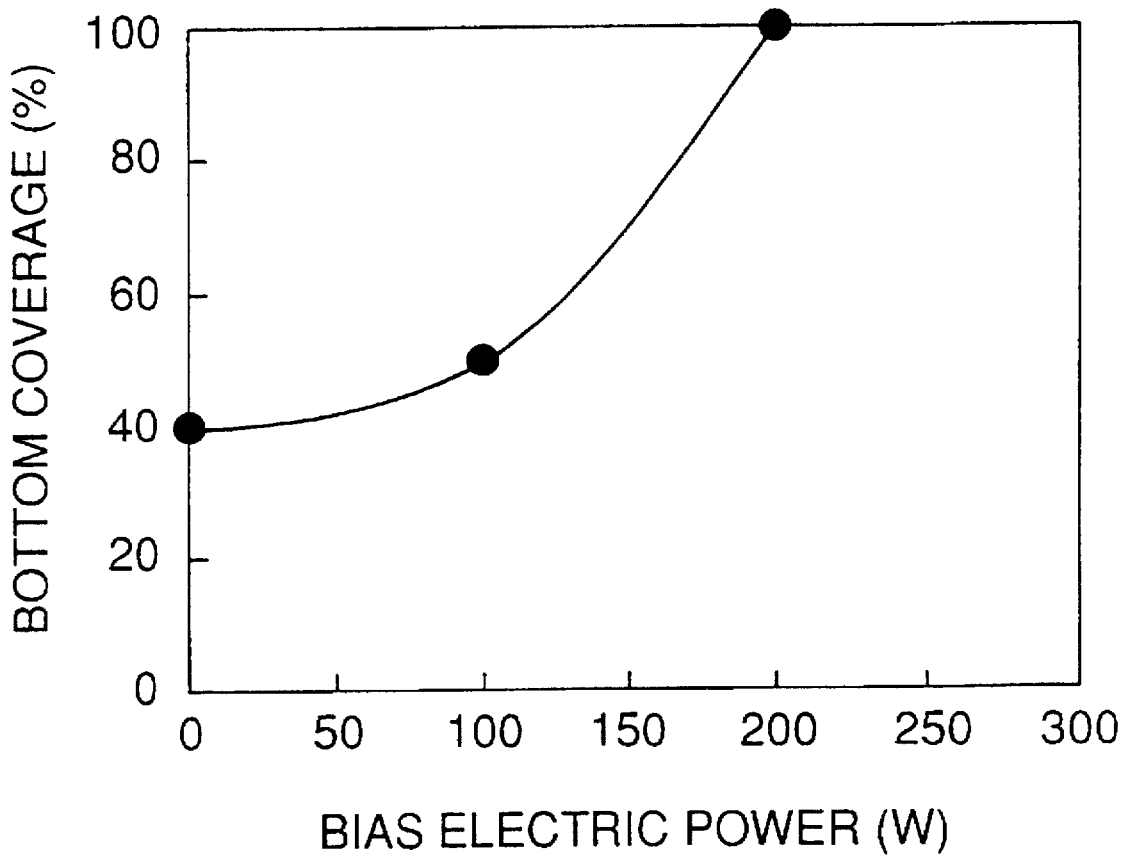
FIG. 6 is a graph showing the dependency of bottom coverage on substrate bias power.

The titanium nitride thin film is used as, for example, a barrier film for a contact portion of a semiconductor integrated circuit. In this application, the film must be deposited on the bottom of a hole which is 0.35 µm or less in diameter and about 1.5 µm in depth. FIG. 6 shows the dependency of the bottom coverage on the substrate bias power. If the thickness of a flat portion is "a", and the thickness of the film deposited on the bottom of a contact hole is "b", the term "bottom coverage" is defined as follows:

$$\text{Bottom coverage } (\%) = (b/a) \times 100$$

The graph indicates that the bottom coverage is rapidly improved as the substrate bias power is increased. The reason for this is thought to be that the ions produced in the plasma are perpendicularly applied to the substrate 21 by the action of the bias voltage of the substrate 21, thereby improving the bottom coverage.

In the above first processing example, the material for the plasma generating electrode is titanium, and titanium is one of the constituents of the deposited film (titanium nitride). Therefore, even if the titanium is mixed in the thin film due to sputtering of the plasma generating electrode, titanium is not a contaminant of the titanium nitride thin film.

The formation of the multi-cusp magnetic field near the inner wall of the processing chamber permits maintenance of a plasma having relatively good uniformity in the central portion of the processing chamber, which is about 5 cm apart from the inner wall of the processing chamber. The formation of the multi-cusp magnetic field is thus very advantageous for depositing a film on a large substrate with good uniformity including uniformity in film thickness, film quality and bottom coverage. Particularly, the combination of the multi-cusp magnetic field and the substrate bias power supply source produces a good uniform bottom coverage, and has further effects. In the processing example in which a titanium nitride film was deposited, the formation of the multi-cusp magnetic field produced a thickness distribution of ±3% within a silicon wafer having a diameter of 6 inches.

A second example of processing for depositing a thin film will be described below. Titanium tetrachloride, hydrogen gas, and argon gas were used as first, second, and third raw materials, respectively. The flowrates of titanium tetrachloride, hydrogen gas, and argon gas were 20 ml/min, 30 ml/min, and 35 ml/min, respectively. The pressure in the processing chamber 20 was set to about 1 Pa, and the temperature of the substrate 21 was set to 550° to 600° C. The output of the radio-frequency power source was 2.5 kW, and the capacity of the capacitor 81 was 500 pF. A silicon oxide film was formed as an under layer of the substrate. When a thin film was deposited under these conditions, the composition of the film depended upon the material of the under layer. For example, when a silicon oxide film was formed as the under layer, the resultant thin film was a metallic titanium film. When a silicon film was formed as the under layer, the resultant thin film was a titanium silicide (TiSi$_2$) film. In this deposition of a thin film, the apparatus of the present invention produced no change of the plasma with time, and no phenomenon that the plasma is not generated, which are observed in a conventional apparatus. It was thus possible to stably deposit a conductor thin film with good reproduceability. Further, no metal thin film was observed on the surface of the plasma generating electrode, and the surface of the plasma generating electrode was not sputtered. Such metallic titanium thin film and titanium silicide thin film are used as, for example, films for decreasing contact resistance of a contact portion of a semiconductor integrated circuit. In this example, the use of the multi-cusp magnetic field and the substrate bias power supply source can improve uniformity and deposit a thin film with good bottom coverage.

When a metallic titanium thin film or titanium silicide thin film was deposited by the plasma enhanced CVD method using a low-density plasma, generally, a black film with high resistance which was contaminated with chlorine was frequently obtained. However, a film having low resistance and metallic luster could be obtained by using the plasma CVD apparatus of the present invention. In this case, the chlorine content of the film was 1% or less. The chlorine content could be decreased to 0.1% or less by applying a bias voltage to the substrate during film deposition. Contamination of a titanium-containing conductive thin film with chlorine has the following problems:

(1) The film has no metallic luster;

(2) Contamination with chlorine increases the resistivity of the film;

(3) Chlorine corrodes an upper wiring material, and, in an extreme case, chlorine causes disconnection of wiring; and (4) With a high chlorine content, the film changes with time, and film characteristics are thus unstable.

The plasma enhanced CVD method of the present invention decreases the chlorine content of the titanium-containing conductive thin film, and can thus solve the above problems. Although the metallic titanium and titanium silicide thin films are used as films for decreasing contact resistance of a contact portion of a semiconductor integrated circuit, the combination of the substrate bias and the multi-cusp magnetic field enables the deposition of a thin film on the peripheral portion of the substrate with good uniformity and bottom coverage.

In deposition of a titanium-containing conductive thin film, when a metallic titanium pipe is used as the plasma generating electrode, titanium causes no impurities even if the plasma generating electrode is a little sputtered, thereby obtaining a thin film with good quality which is not contaminated with impurities.

A third processing example in which the apparatus shown in FIG. 8 is used will be described. In FIGS. 8 and 2, titanium tetrachloride, hydrogen gas, and nitrogen gas were used as first, second, and third raw materials which were contained in the raw material containers 1a, 1b and 1c, respectively. The flowrates of titanium tetrachloride, hydrogen gas, and nitrogen gas were 20 ml/min, 200 ml/min, and 20 ml/min, respectively. The pressure in the processing chamber 20 was set to about 1 Pa, and the temperature of the substrate 21 was set to 450° to 600° C. The output of the radio-frequency power source 52 was 3.0 kW, and the capacity of the variable capacitor 81a shown in FIG. 8 was variable within the range of 100 pF to 10 µF. The DC bias voltage induced in the plasma generating electrode 61 was monitored, and the capacity of the capacitor was adjusted so that the DC bias voltage was −250 V. In deposition of a thin film under these conditions, a film consisting of titanium nitride as a main component was deposited at a rate of about 60 nm/min. The film consisting of titanium nitride as a main component had resistivity of 80 µΩm. Even in 100 batch depositions of thin films, substantially the same thin film could be deposited with good reproduceability.

A fourth processing example in which the apparatus shown in FIG. 10 is used will be described. The types and flowrates of the gases introduced, the substrate temperature, and the output of the radio-frequency power source 52 were the same as in the above first processing example, except that a DC power source 82 was used as the ground coupling mechanism 80b. The DC bias voltage of the plasma generating electrode 61 was controlled to a constant −250 V by using the DC power source 82. The capacity of the variable capacitor 81a was kept constant at 500 pF. In deposition of a thin film under these conditions, a film consisting of titanium nitride as a main component was deposited at a rate of about 30 nm/min, as in the above third processing example.

Figure 7:
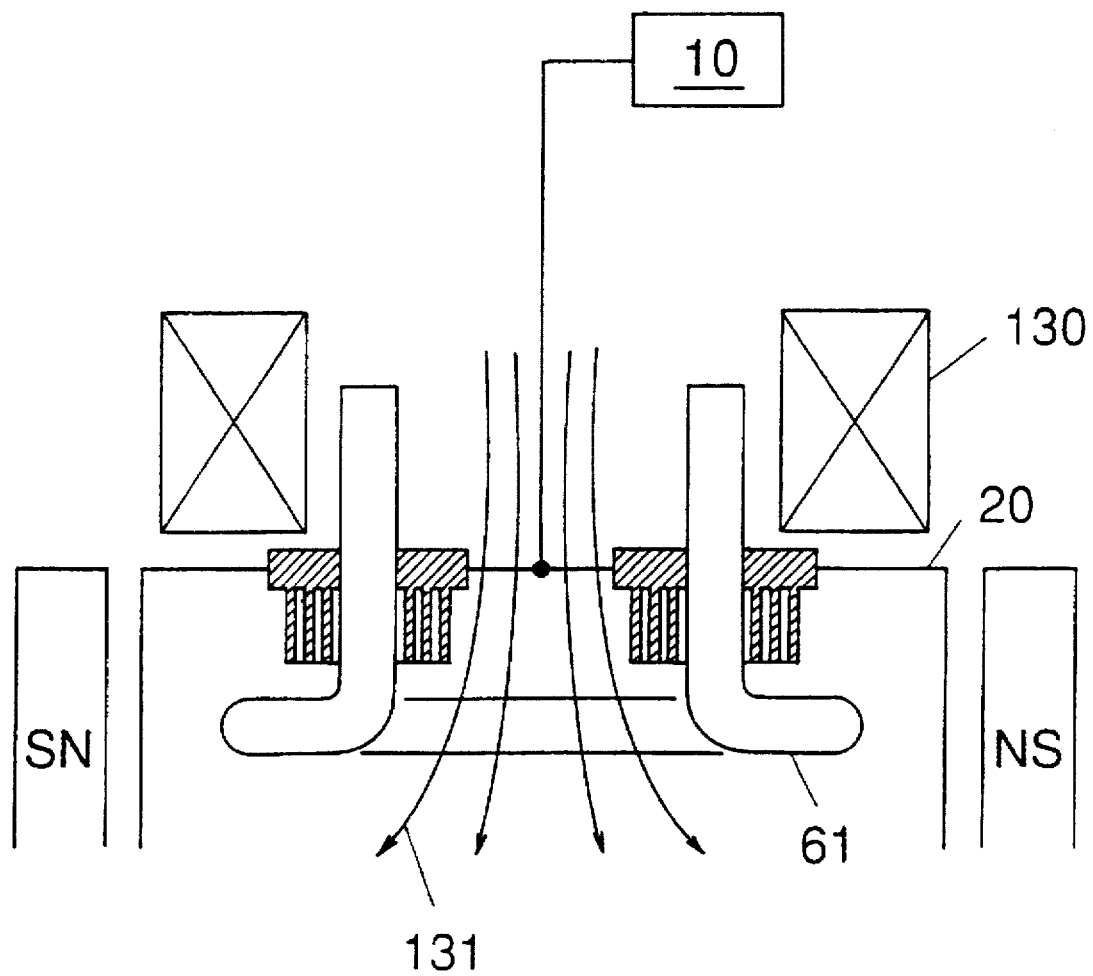
FIG. 7 is a block diagram of a principal portion of a plasma enhanced CVD apparatus in another embodiment of the present invention.

FIG. 7 is a block diagram showing a principal portion of a plasma enhanced CVD apparatus in accordance with another embodiment of the present invention. This embodiment is the same as the embodiment shown in FIG. 1 except that a solenoid coil 130 is disposed above the plasma generating electrode 61. The lines of magnetic force 131 generated by the solenoid coil 130 pass through a portion near the center of the plasma generating electrode 61 comprising a coil of one turn, and diverge. A plasma having a higher density can be generated by the action of the lines of magnetic force 131, and ignition of discharge in the apparatus in this embodiment can be facilitated by the action of the lines of magnetic force 131. The use of this apparatus permits the deposition of thin films of titanium nitride, metallic titanium, titanium silicide, and tungsten nitride, as in the apparatus shown in FIG. 1.

In the present invention, since the plasma generating electrode is disposed in the processing chamber, and one end of the plasma generating electrode is grounded through the capacitor, a low pressure, high density stable plasma with small changes with time can be obtained in deposition of a titanium-containing conductive thin film. It is also possible to obtain a high-quality titanium-containing conductive thin film having a low chlorine content. Further the DC bias component induced in the plasma generating electrode can be optimized by controlling the capacity of the capacitor so as to prevent sputtering of the plasma generating electrode in plasma processing.

Although only preferred embodiments are specifically illustrated and described herein, it will be appreciated that many modifications and variations of the present invention are possible in light of the above teachings and within the purview of the appended claims without departing from the spirit and intended scope of the invention.

What is claim:

1. A method of depositing a titanium-containing conductive thin film on a substrate by a plasma enhanced chemical vapor deposition (CVD) process in a processing chamber into which raw material gases are introduced, the method comprising:

providing a plasma generating electrode having two terminals in the processing chamber;

connecting one of the terminals of the plasma generating electrode to a radio frequency power supply source; and grounding the other of the terminals through a capacitor to generate a plasma in the processing chamber so as to deposit the thin film on the substrate.

2. The method according to claim 1, wherein a titanium nitride thin film is deposited by using titanium tetrachloride, hydrogen gas, and nitrogen gas as the raw material gases.

3. The method according to claim 1, wherein the thin film is a metallic titanium thin film and is deposited by using titanium tetrachloride, hydrogen gas, and argon gas as the raw material gases and a silicon oxide film as an underlayer.

4. The method according to claim 1, wherein the thin film is a titanium silicide thin film and is deposited by using titanium tetrachloride, hydrogen gas, and argon gas as the raw material gases and a silicon film as an underlayer.

5. The method according to claim 1, wherein the capacitor has an electrostatic capacity of 100 pF to 10 µF.

6. The method according to claim 1, wherein the capacitor is a variable capacitor.

7. The method according to claim 1, wherein a surface of the plasma generating electrode is titanium.

8. The method according to claim 1, wherein the plasma generating electrode comprises a coil of substantially one turn.

9. The method according to claim 1, wherein a potential control mechanism is connected to the other of the terminals so as to control a potential of the plasma generating electrode.

10. The method according to claim 9, wherein the potential control mechanism comprises a DC power source and an inductor.

11. The method according to claim 1, further comprising the step of providing a multi-cusp magnetic field generating mechanism which can generate a multi-cusp magnetic field in the processing chamber.

12. The method according to claim 1, further comprising the step of providing an exhaust mechanism provided with a pressure control mechanism for controlling a pressure in the processing chamber constant.

13. The method according to claim 1, further comprising the step of providing a bias applying mechanism for applying a bias voltage to the substrate.

14. The method according to claim 5, wherein the capacitor is a variable capacitor.

* * * * *